(12) United States Patent
Chen

(10) Patent No.: US 7,517,110 B2
(45) Date of Patent: Apr. 14, 2009

(54) LIGHT EMITTING DIODE

(75) Inventor: Wei-An Chen, Hsin-Chu Hsein (TW)

(73) Assignee: Lighthouse Technology Co., Ltd., Hsin-Chu Hsien (TW)

( * ) Notice: Subject to any disclaimer, the term of this patent is extended or adjusted under 35 U.S.C. 154(b) by 0 days.

(21) Appl. No.: 11/802,580

(22) Filed: May 23, 2007

(65) Prior Publication Data

US 2008/0186712 A1  Aug. 7, 2008

(30) Foreign Application Priority Data

Feb. 2, 2007  (TW) ............................... 96202031 U

(51) Int. Cl.
*F21V 33/00* (2006.01)

(52) U.S. Cl. .................. 362/235; 362/241; 362/296; 362/545; 362/800

(58) Field of Classification Search .................. 362/253, 362/800, 518, 545, 241, 296, 346
See application file for complete search history.

(56) References Cited

U.S. PATENT DOCUMENTS

| | | | | |
|---|---|---|---|---|
| 7,008,079 B2* | 3/2006 | Smith | ......................... | 362/235 |
| 7,128,444 B2* | 10/2006 | Isokawa et al. | ............. | 362/311 |
| 2003/0189830 A1* | 10/2003 | Sugimoto et al. | ........... | 362/294 |

* cited by examiner

*Primary Examiner*—Laura Tso
(74) *Attorney, Agent, or Firm*—Troxell Law Office PLLC

(57) ABSTRACT

An LED including housing, lead frame in the housing, light-emitting chip, and packed colloid; pit accommodation portion being disposed in the housing to expose lead frame, and multiple reflective sidewalls at various inclinations being disposed on a side of accommodation portion; the chip being disposed on a lead frame; streams of light form the chip traveling in different directions when reflected by those sidewalls; and most of those streams of light being emitted out of the accommodation portion to promote luminance performance of the LED.

17 Claims, 11 Drawing Sheets

LIGHT EMITTING DIODE

BACKGROUND OF THE INVENTION (a) Field of the Invention

The present invention is related to a light emitting diode (LED), and more particularly, to one that promotes luminance performance by reducing light source loss.

(b) Description of the Prior Art

FIG. 1 shows a schematic view of an SMD LED of the prior art, the LED 1 is comprised of a housing 11, an accommodation space 113 enclosed by a first side 111 and a second side 112 of the housing 11; a light emitting chip 12 is placed on a bottom of the accommodation space; two separately provided lead frames 13, 14 are disposed in the housing 11; the light emitting chip 12 disposed on the lead frame 13 is electrically connected to both lead frames 13, 14 respectively by means of a conductor 15; and a colloid is finally packed in the accommodation space 113 to complete a structure of the LED 1.

Certain portion of streams of light emitted from the light-emitting chip 12 upon entering into where two different types of media of air and the packed colloid present will be reflected back to the packed colloid 16 and prevented from entering into the ambient air. Some of those streams of light re-entering the packed colloid 16 are reflected onto while others are reflected into the first and the second sides 111, 112 due to total reflection. Whereas both the first and the second sides 111, 112 are of greater inclinations, i.e., an included angle defined respectively by the bottoms of the first and the second sides 111, 112 are greater. Accordingly, those streams of light re-entering the first and the second sides 111, 112 can be easily reflected again into a bottom of the accommodation space 113 without effectively leaving the accommodation space 113 to result in loss of streams of light, reduced use efficiency of streams of light, and poor luminance performance of the LED.

An improvement has been attempted to provide smaller inclinations for the first and the second sides, i.e., a smaller and more inclined included angle defined respectively by both first and second sides and the bottom of the accommodation space for those streams of light reflected from the packed colloid to emit towards where above the accommodation space. However, both the first and the second sides disposed in the accommodation space at greater inclinations result in smaller area of the bottom of the accommodation space and larger area at an opening of the accommodation space to make it very difficult in properly locating both of the light-emitting chip and the conductor.

SUMMARY OF THE INVENTION

The primary purpose of the present invention is to provide an LED to solve problems found with the prior art to promote luminance performance of the LED by reducing loss of light source.

To achieve the purpose, an LED of the present invention is essentially comprised of a housing, one or a plurality of lead frame, one or a plurality of light-emitting chip, and packed colloid. Wherein, the lead frame is disposed in the housing; one or a plurality of pit accommodation portion to expose the lead frame is formed to the housing; multiple reflective sidewalls at various inclinations are disposed on sides of the accommodation portion; the light-emitting chip is disposed on the lead frame; streams of light emitted from the light-emitting chip travel in different directions through those reflective sidewalls to cause most of those streams of light to leave the accommodation portion for promoting luminance performance of the LED.

DETAILED DESCRIPTION OF THE PREFERRED EMBODIMENTS

Figure 1:
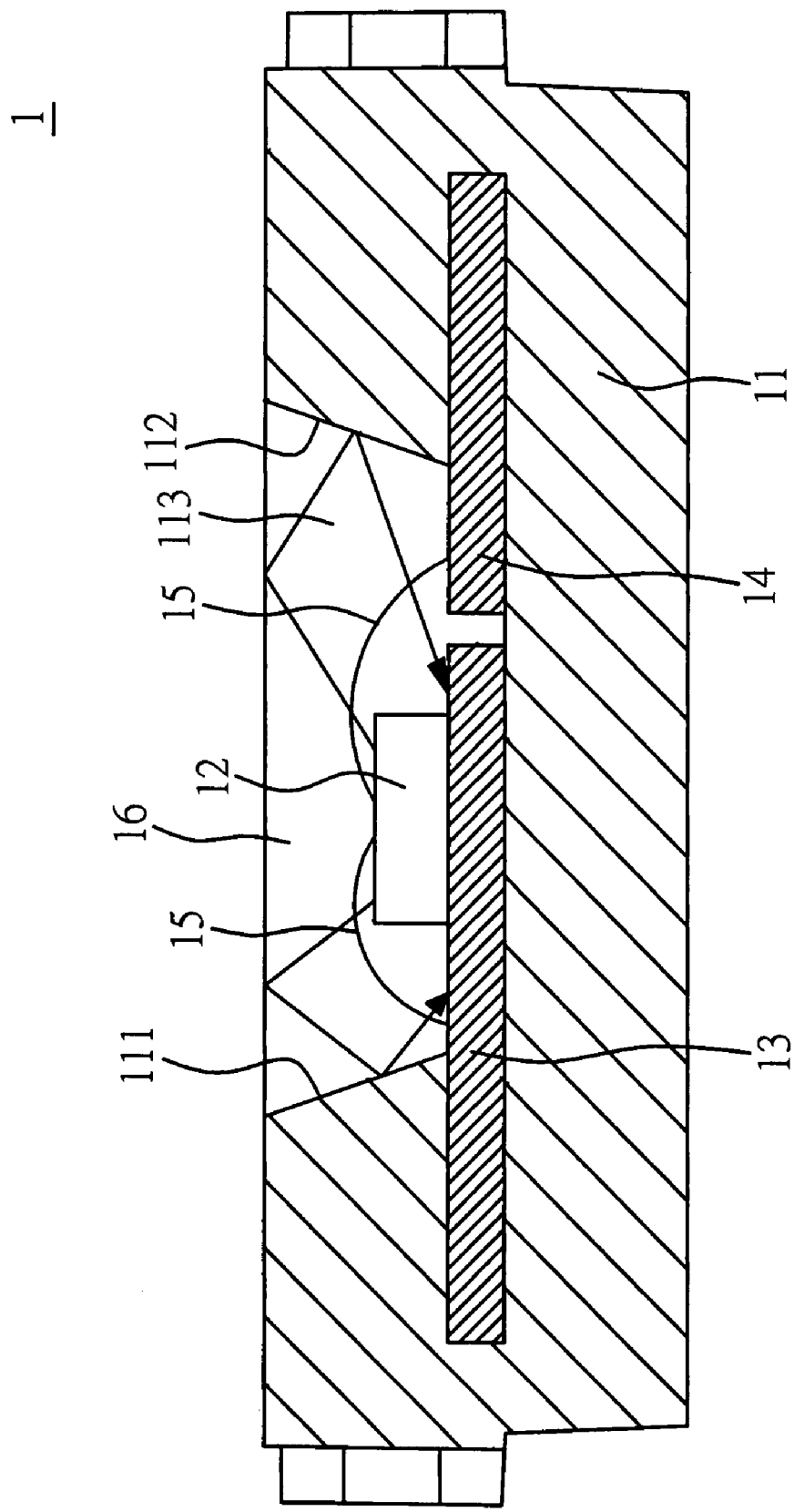
FIG. 1 is a schematic view showing a construction of an LED of the prior art.
Figure 2:
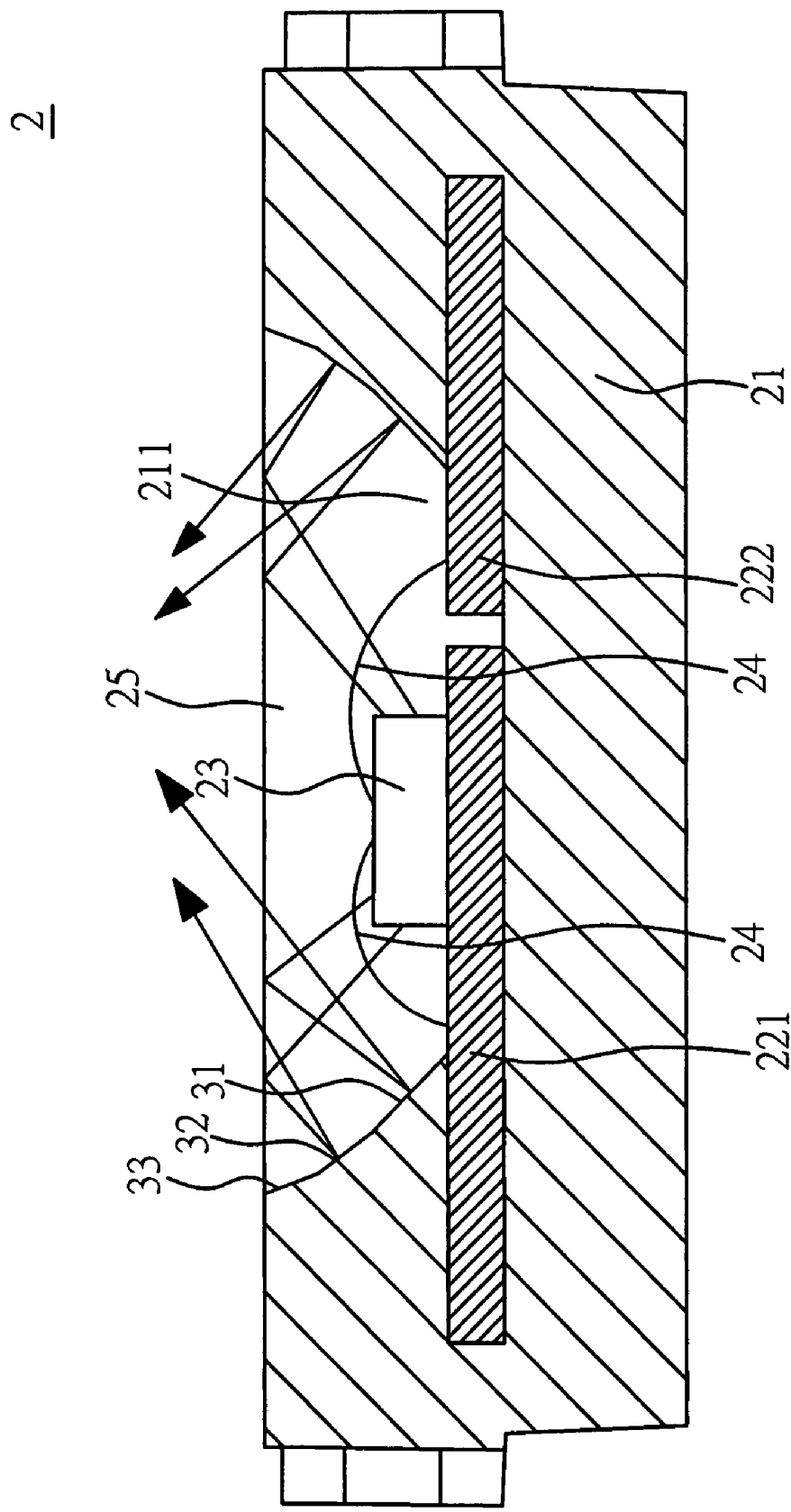
FIG. 2 is a schematic view showing a construction of an LED of the present invention.

Referring to FIG. 2, an LED 2 of the present invention is essentially comprised of a housing 21, one or a plurality of light-emitting chip 23, a conductor 24, and a packed colloid 25.

Figure 3:
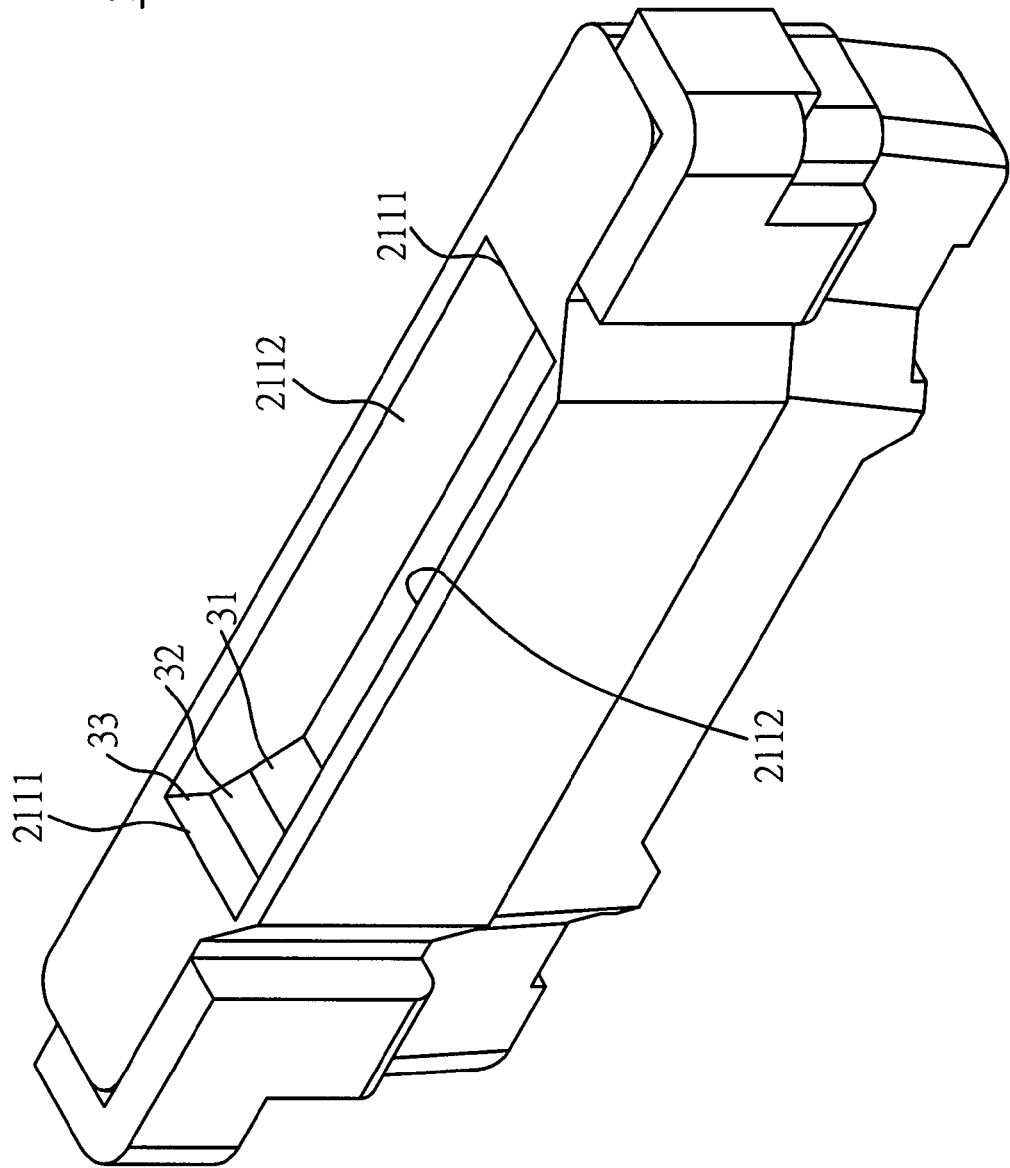
FIG. 3 is a perspective view of a first preferred embodiment of the present invention.
Figure 4:
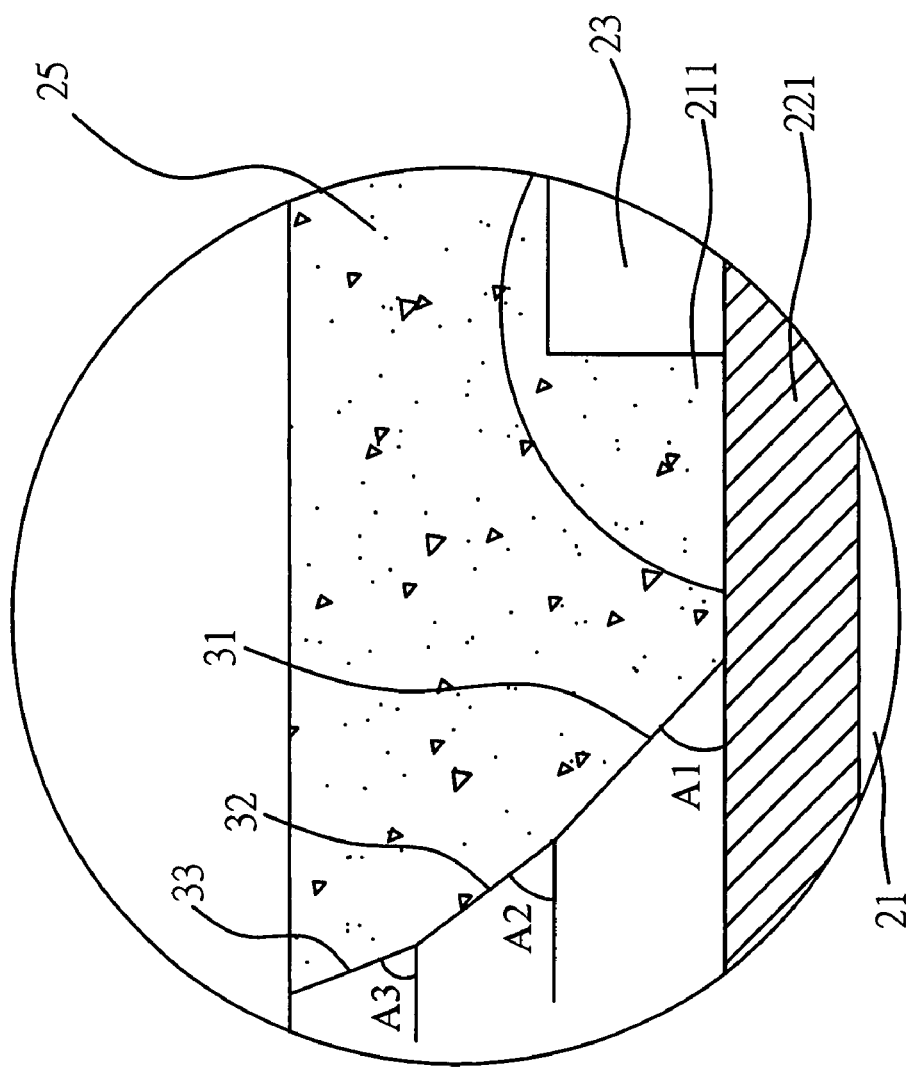
FIG. 4 is a magnified view showing each reflective sidewall of the present invention.
Figure 8:
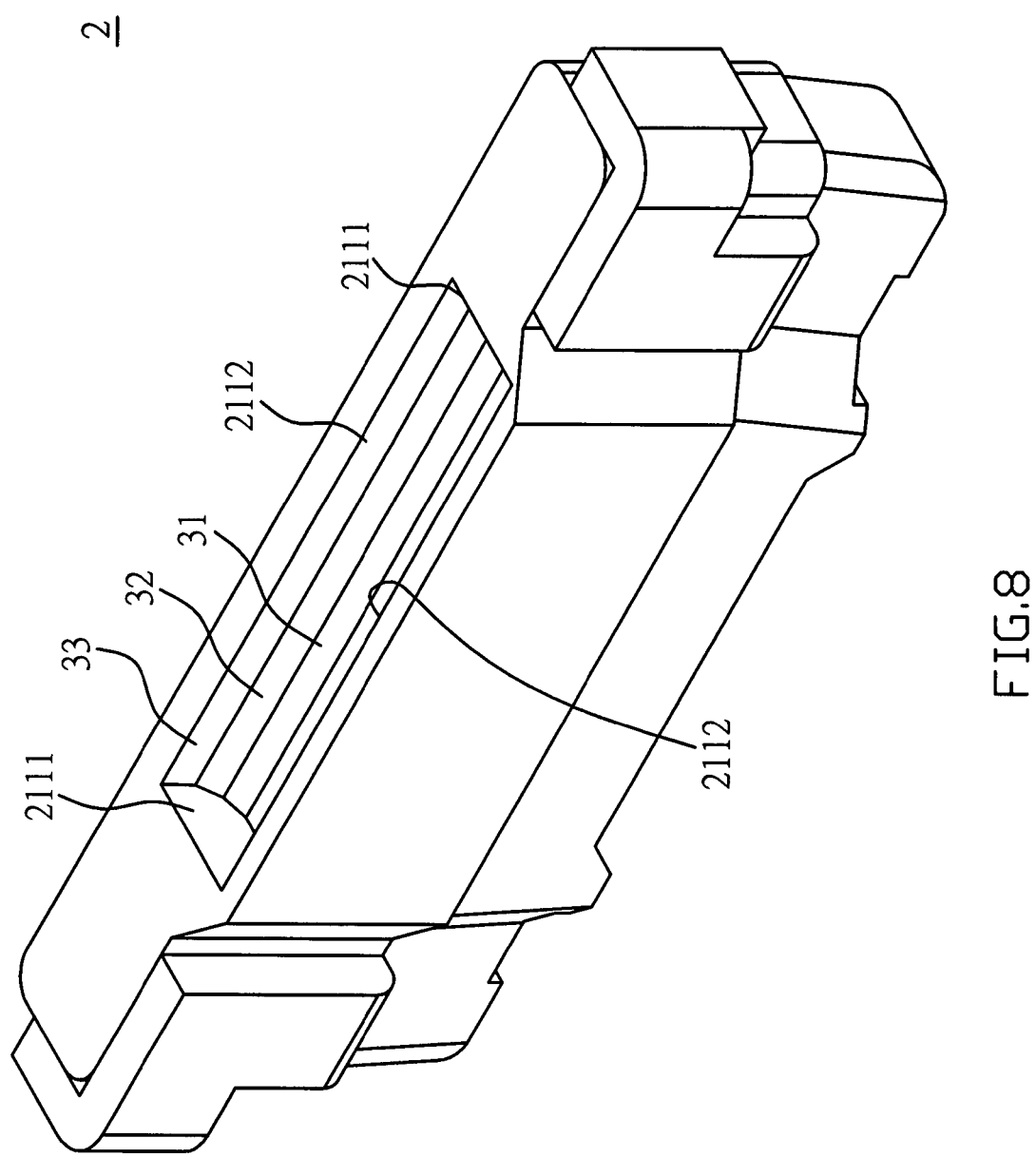
FIG. 8 is a perspective view showing a second preferred embodiment of the present invention.

The housing 21 containing two lead frames 221, 222, and a pit accommodation portion 211; both lead frames 221, 222 are partially exposed from a bottom of the accommodation portion 211; and multiple reflective sidewalls at various inclinations are disposed to multiple sides of the accommodation portion 211. As illustrated in FIG. 3, the accommodation portion 211 contains two pairs of a first and side 2111 and a second side 2112 opposite to each other; the first side 2111 is shorter than the second side 2112; and multiple, three respectively a first, a second, and a third reflective sidewalls 31, 32, 33 in the preferred embodiment as illustrated, at various inclinations are disposed to the first side 2111. As illustrated in FIG. 4, inclinations respectively of those reflective sidewalls are increasingly greater up from the bottom of the accommodation portion 211; that is, a relation among three inclinations A1, A2, and A3 respectively included by the first, the second, and the third reflective sidewalls 31, 32, 33 and their corresponding horizontal level indicates A1<A2<A3, and similarly the first, the second, and the third reflective sidewalls 31, 32, 33 may be provided on the second side 2112 as illustrated in FIG. 8.

The light-emitting chip 23 is placed on either of both lead frames 221, 222; and on the lead frame 221 in the preferred embodiment as illustrated.

One or a plurality of light-emitting chip 23 is disposed on the lead frame 221 and is electrically conducted to both lead frames 221, 222 by means of the conductor 24.

The packed colloid 25 is disposed in the accommodation portion 211.

Figure 9:
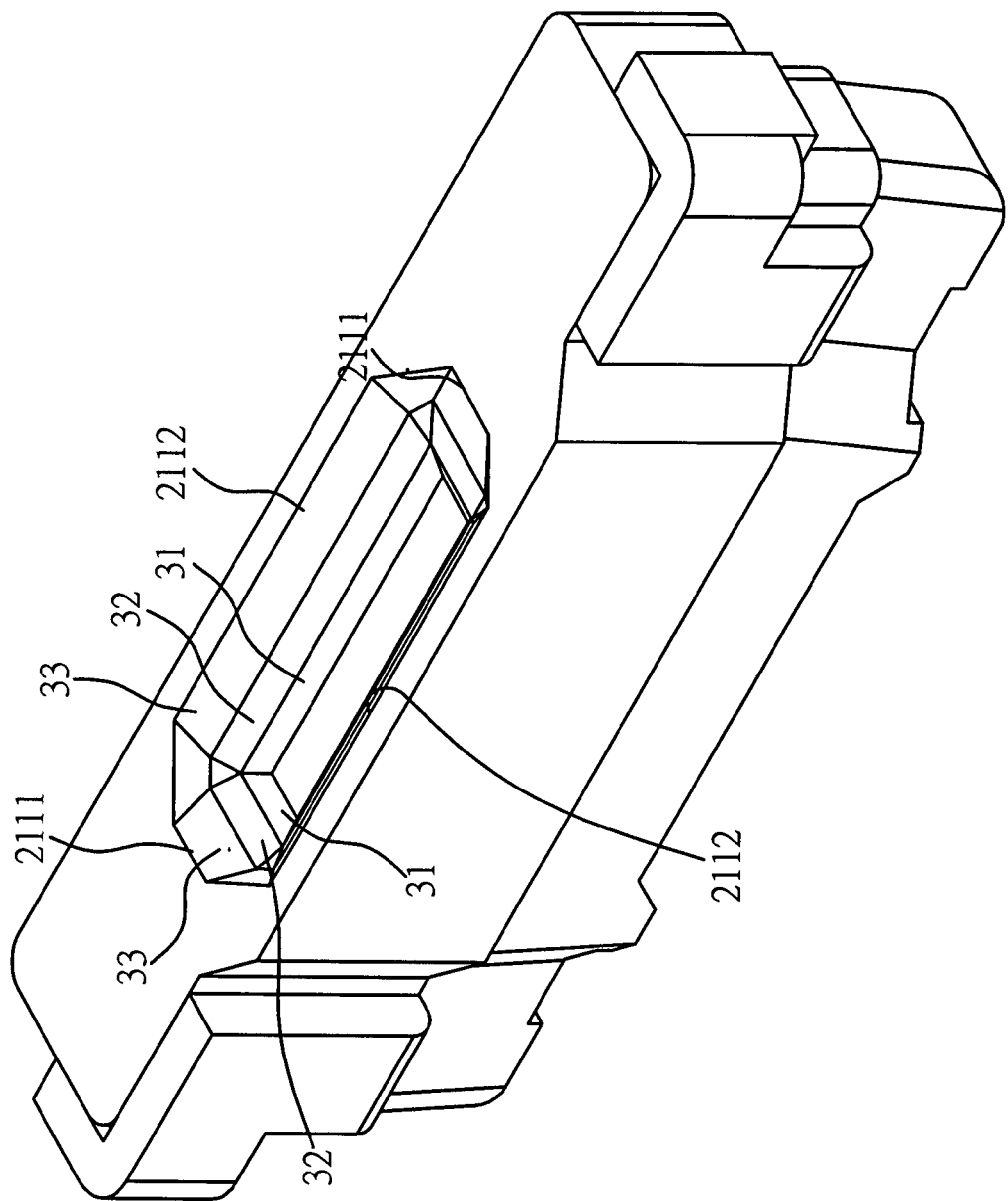
FIG. 9 is a perspective view showing a construction of an LED in a third preferred embodiment of the present invention.
Figure 10:
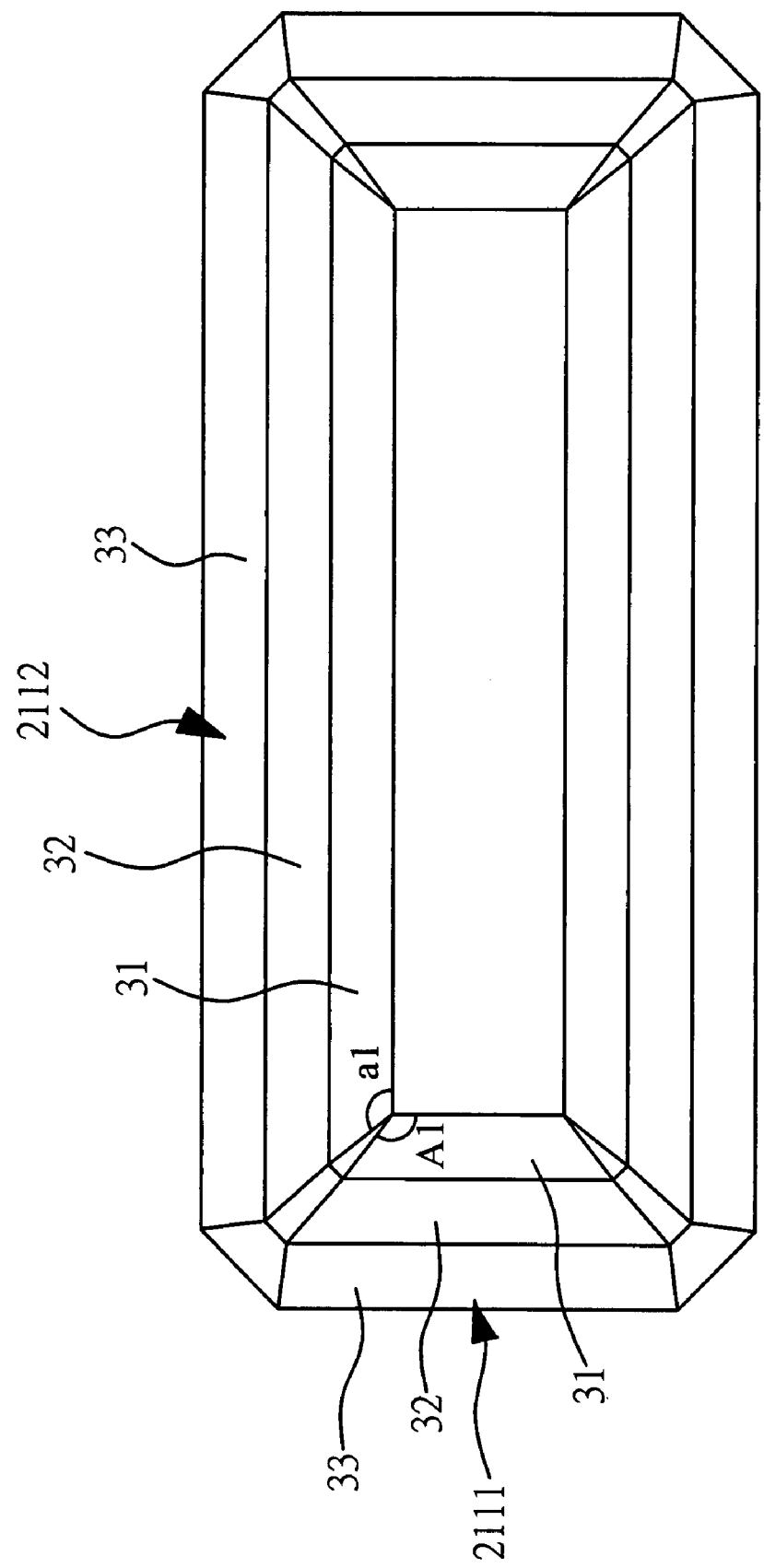
FIG. 10 is a schematic view showing a construction of a first side, a second side, and each reflective sidewall of the present invention.
Figure 11:
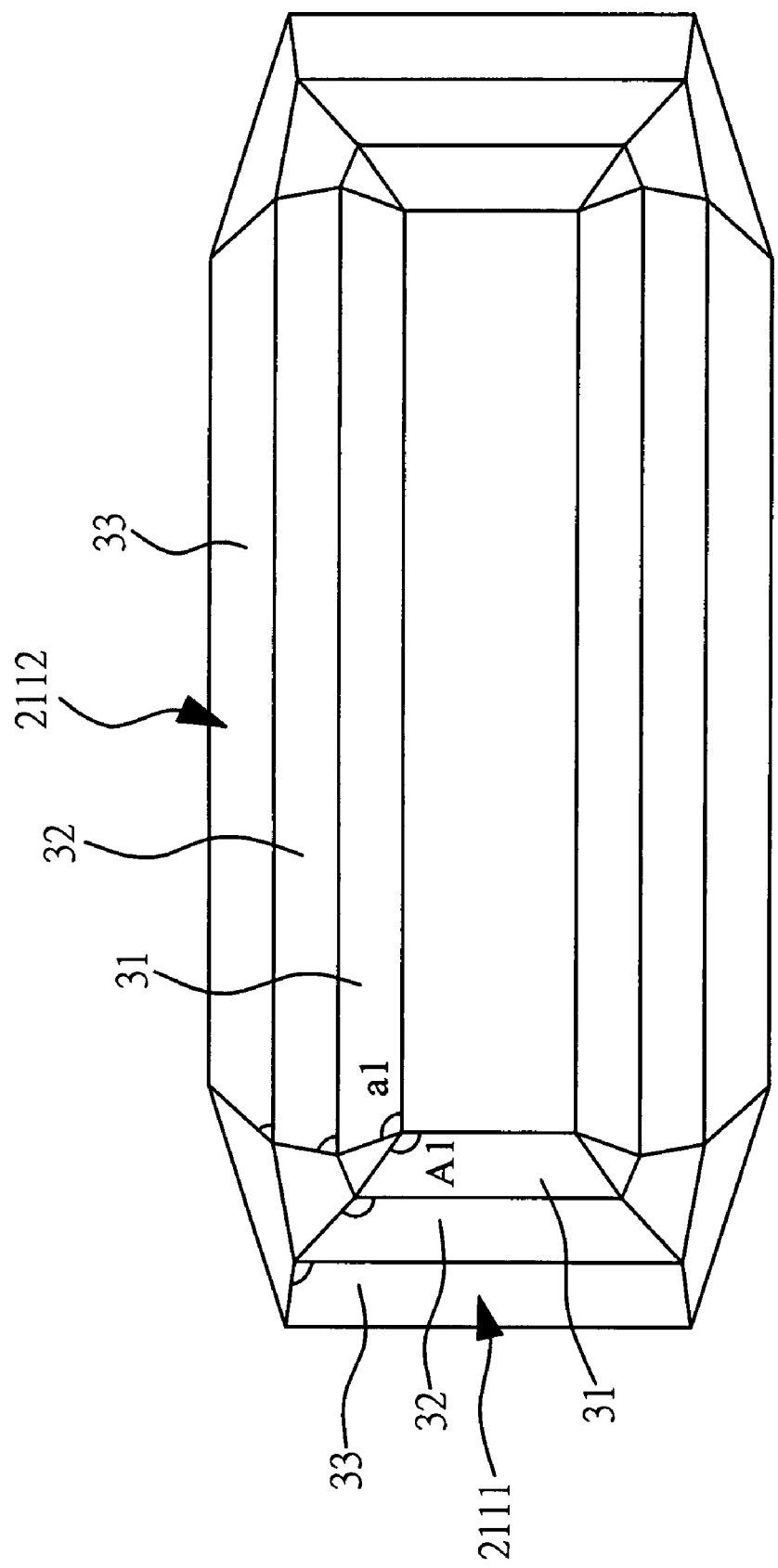
FIG. 11 is a schematic view showing another construction of the first side, the second side, and each reflective sidewall of the present invention.

When streams of light emitted from the light-emitting chip 23 enter into where two different media of air and the colloid 25 present, certain portion of those streams of light will be reflected back to the colloid 25 and prevented from entering into ambient air. Those streams of light prevented from entering into ambient air are reflected to the first, the second, and the third reflective sidewalls 31, 32, 33 or entering into the first, the second, and the third reflective sidewalls 31, 32, 33 due to total reflection. Whereas, inclinations of the first and the second reflective sidewalls 31, 32 are flatter, streams of light entering into both the first and the second reflective sidewalls 31, 32 will be emitted toward where above the accommodation portion 211 thus to promote luminance performance of the LED. Wherein, those multiple reflective sidewalls of various inclinations may be disposed on the first side 2111 in a first preferred embodiment as illustrated 3 or on the second side 2112 in a second preferred embodiment as illustrated in FIG. 8; or on the first side 2111 and on the second side 2112 in a third preferred embodiment as illustrated in FIG. 9 to achieve the same purpose of promoting luminance performance of the LED. As illustrated in FIG. 9 when each of both the first and the second sides 2111, 2112 is provided with the first, the second, and the third reflective sidewalls 31, 32, 33, a relation of corresponding inclinations between pairs of the first, the second, and the third reflective sidewalls 31, 32, 33 from the first and the second sides 2111, 2112; that is, the inclination A1 of the first reflective sidewall 31 on the first side 2111 is identical with as illustrated in FIG. 10 or different from as illustrated in FIG. 11 an inclination a1 of the first reflective sidewall 31 on the second side 2112.

Figure 5:
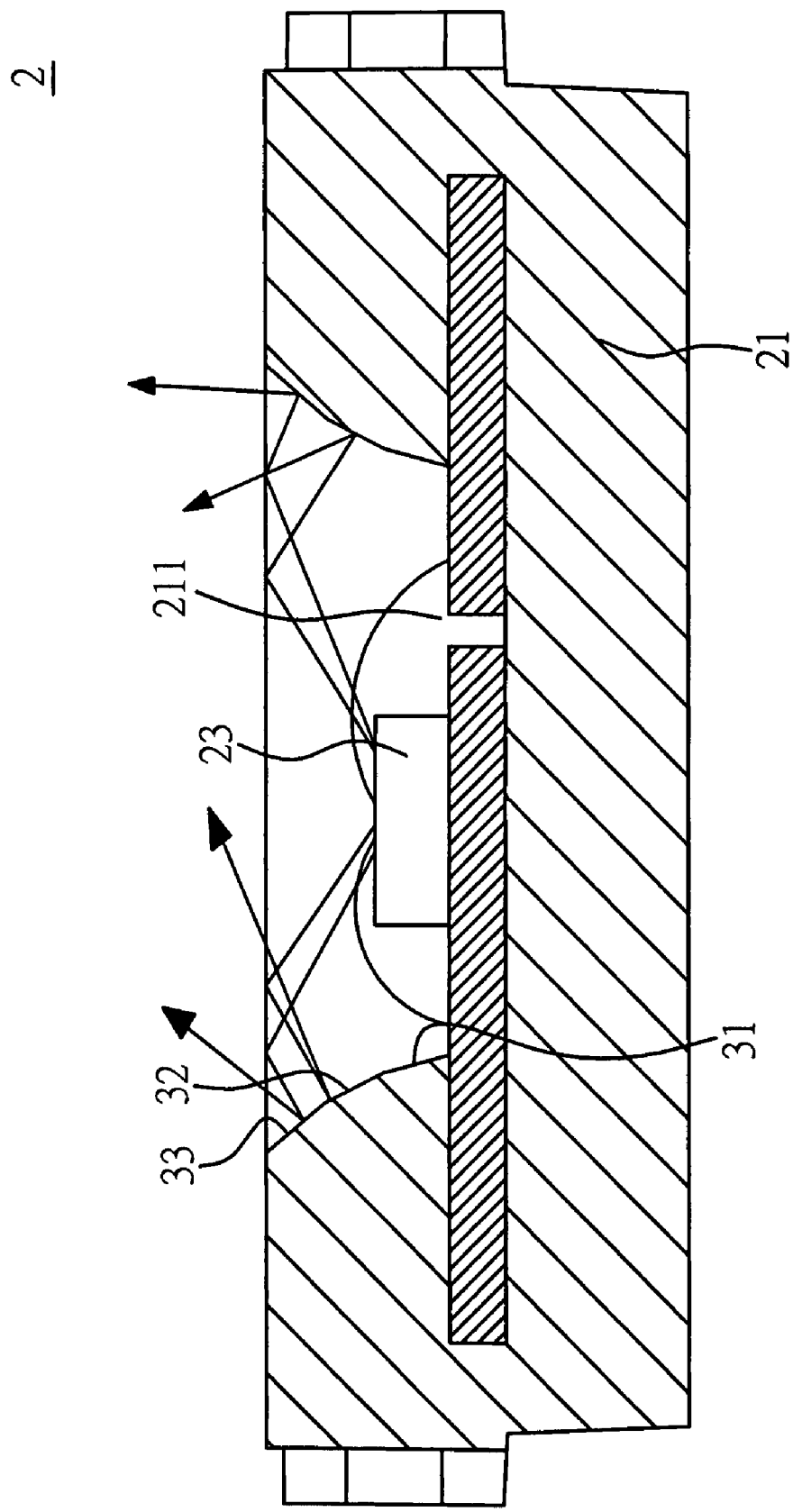
FIG. 5 is a schematic view showing another construction of the LED of the present invention.
Figure 6:
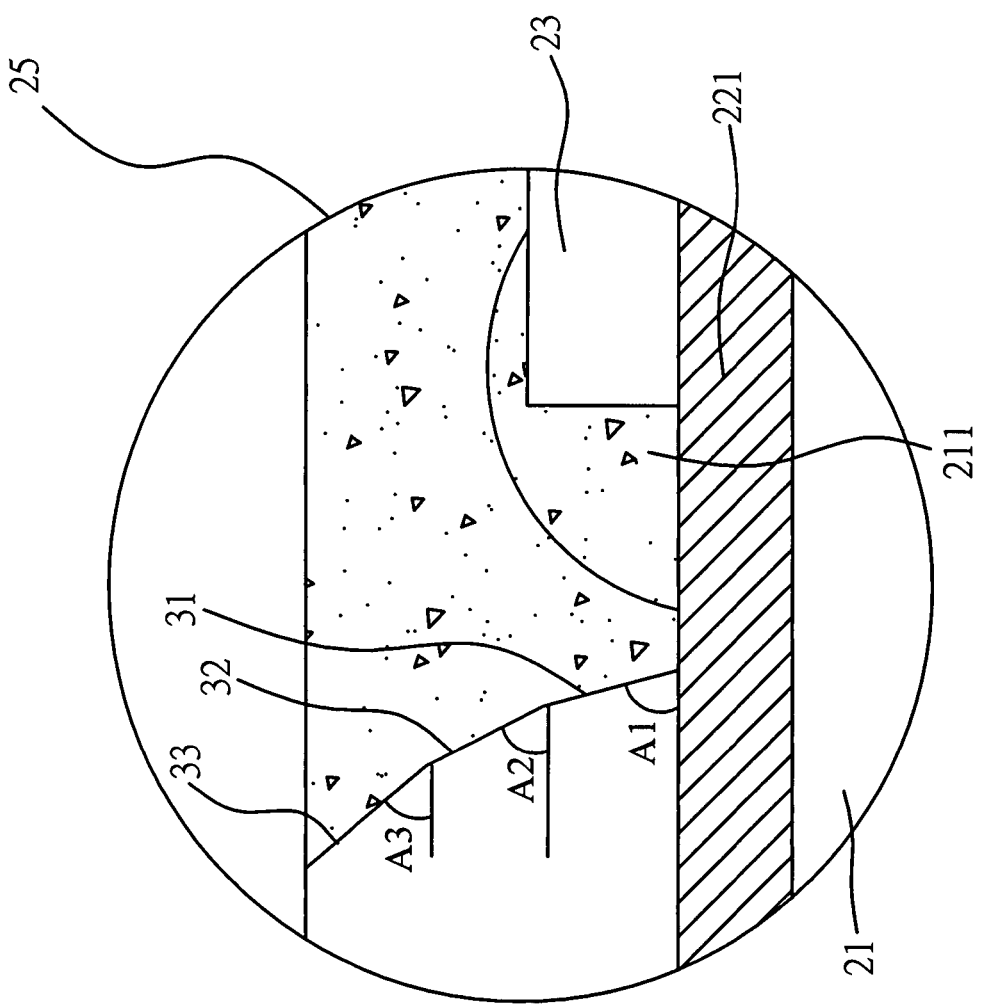
FIG. 6 is another magnified view showing another construction of each reflective sidewall of the present invention.

In another preferred embodiment of the present invention as illustrate in FIGS. 5 and 6, the accommodation portion is provided with a first, a second, and a third reflective sidewalls 31, 32, 33; however, inclinations of the first, the second, and the third reflective sidewalls 31, 32, 33 are increasingly reduced up from the bottom of the accommodation portion 211; that is, a relation among three inclinations A1, A2, and A3 respectively included by the first, the second, and the third reflective sidewalls 31, 32, 33 and their corresponding horizontal level indicates A1>A2>A3.

When streams of light emitted from the light-emitting chip 23 enter into where two different media of air and the colloid 25 present, certain portion of those streams of light will be reflected back to the colloid 25 and prevented from entering into ambient air. Those streams of light prevented from entering into ambient air are reflected to the first, the second, and the third reflective sidewalls 31, 32, 33 or entering into the first, the second, and the third reflective sidewalls 31, 32, 33 due to total reflection. Whereas, inclinations of the second and the third reflective sidewalls 32, 33 are flatter, streams of light entering into both the second and the third reflective sidewalls 32, 33 will be emitted toward where above the accommodation portion 211 thus to promote luminance performance of the LED.

Figure 7:
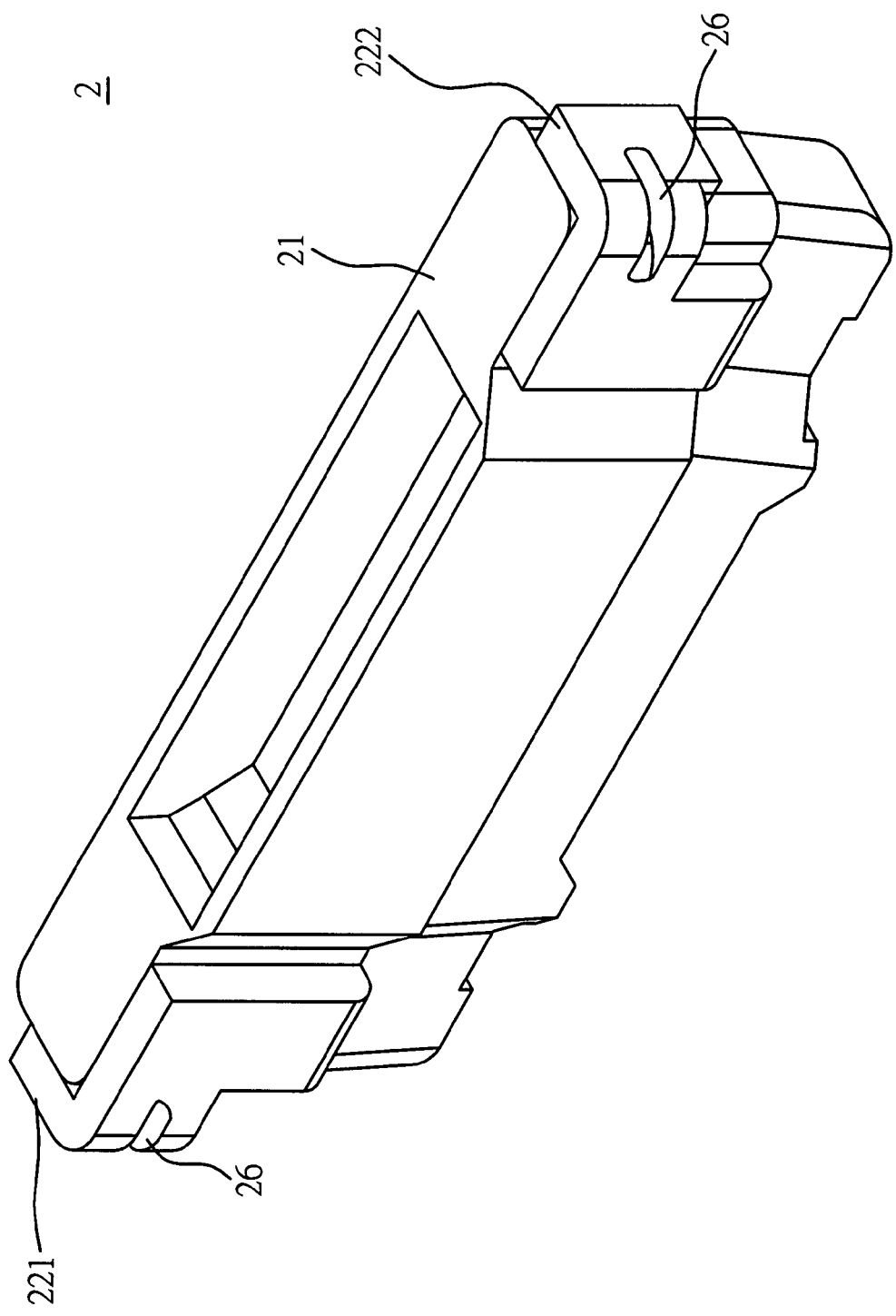
FIG. 7 is a perspective view showing another construction of the LED of the present invention.

Furthermore, as illustrate in FIG. 7, a through hole 26 is each provided to both lead frames 221, 222 at where they are exposed from the housing 21 so to reduce stress created when both lead frames 221, 222 are curved.

It is to be noted that an LED of the present invention provides the following advantages:

1. Traveling direction of streams of light entering into multiple sidewalls provided with various inclinations as reflected by packed colloid for those streams of light to be emitted towards where above the accommodation portion to promote luminance performance of the LED by reducing loss of light source due to emission to the bottom of the accommodation portion; and 2. The bottom of the accommodation portion allows better arrangement of light-emitting chip and conductor due to multiple reflective sidewalls at various inclinations are provided.

The present invention provides an improved structure of an LED, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

I claim:

1. A light emission diode comprising:
   a housing containing lead frame and a pit accommodation portion to expose the lead frame, and one or a plurality of sides of the accommodation portion being disposed with multiple reflective sidewalls at various inclinations;
   one or a plurality of lead frame for placement of a light-emitting chip; one or a plurality of light-emitting chip disposed on the lead frame; and
   a colloid packed in the accommodation portion,
   wherein inclinations of the multiple reflective sidewalls are increasingly smaller from a bottom of the accommodation portion to a top of the inclination portion.

2. The light emission diode as claimed in claim 1, wherein one or a plurality of pair of first and second sides opposite to each other is disposed to the accommodation portion with the first side shorter than the second side; and multiple reflective sidewalls are disposed on the first side.

3. The light emission diode as claimed in claim 1, wherein one or a plurality of pair of first and second sides opposite to each other is disposed to the accommodation portion with the first side shorter than the second side; and multiple reflective sidewalls are disposed on the second side.

4. A light emission diode comprising a housing containing lead frame and one or a plurality of pit accommodation portion to expose the lead frame, one or a plurality of pair of a first and a second sides opposite to each other is provided to the accommodation portion, the first side is shorter than the second side, and multiple reflective sidewalls at various inclinations are provided on the first side; one or a plurality of lead frame for placement of a light-emitting chip; one or a plurality of light-emitting chip disposed on the lead frame; and a colloid packed in the accommodation portion.

5. The light emission diode as claimed in claim 4, wherein inclinations of the multiple reflective sidewalls are increasingly greater from a bottom of the accommodation portion to a top of the accommodation portion.

6. The light emission diode as claimed in claim 4, wherein inclinations of the multiple reflective sidewalls are increasingly smaller from a bottom of the accommodation portion to a top of the accommodation portion.

7. The light emission diode as claimed in claim 4, wherein multiple reflective sidewalls are further disposed on the second side of the accommodation portion.

8. The light emission diode as claimed in claim 7, wherein multiple reflective sidewalls on the first side of the accommodation portion are each of an inclination that is equal to that of each of their corresponding multiple reflective sidewalls on the second side.

9. The light emission diode as claimed in claim 7, wherein multiple reflective sidewalls on the first side of the accommodation portion are each of an inclination that is different from that of each of their corresponding multiple reflective sidewalls on the second side.

10. A light emission diode comprising a housing containing lead frame and one or a plurality of pit accommodation portion to expose the lead frame, one or a plurality of pair of a first and a second sides opposite to each other is provided to the accommodation portion, the first side is shorter than the second side, and multiple reflective sidewalls at various inclinations are provided on the second side; one or a plurality of lead frame for placement of a light-emitting chip; one or a plurality of light-emitting chip disposed on the lead frame; and a colloid packed in the accommodation portion.

11. The light emission diode as claimed in claim 10, wherein inclinations of the multiple reflective sidewalls are increasingly greater from a bottom of the accommodation portion to a top of the accommodation portion.

12. The light emission diode as claimed in claim 10, wherein inclinations of the multiple reflective sidewalls are increasingly smaller from a bottom of the accommodation portion to a top of the accommodation portion.

13. The light emission diode as claimed in claim 10, wherein the first side is further provided with multiple reflective sidewalls.

14. The light emission diode as claimed in claim 13, wherein multiple reflective sidewalls on the first side of the accommodation portion are each of an inclination that is equal to that of each of their corresponding multiple reflective sidewalls on the second side.

15. The light emission diode as claimed in claim 13, wherein multiple reflective sidewalls on the first side of the accommodation portion are each of an inclination that is different from that of each of their corresponding multiple reflective sidewalls on the second side.

16. A light emission diode comprising:
a housing containing lead frame and a pit accommodation portion to expose the lead frame, and one or a plurality of sides of the accommodation portion being disposed with multiple reflective sidewalls at various inclinations;
one or a plurality of lead frame for placement of a light-emitting chip; one or a plurality of light-emitting chip disposed on the lead frame; and
a colloid packed in the accommodation portion,
wherein one or a plurality of pair of first and second sides opposite to each other is disposed to the accommodation portion with the first side shorter than the second side; and multiple reflective sidewalls are disposed on the first side.

17. A light emission diode comprising:
a housing containing lead frame and a pit accommodation portion to expose the lead frame, and one or a plurality of sides of the accommodation portion being disposed with multiple reflective sidewalls at various inclinations;
one or a plurality of lead frame for placement of a light-emitting chip;
one or a plurality of light-emitting chip disposed on the lead frame; and
a colloid packed in the accommodation portion,
wherein one or a plurality of pair of first and second sides opposite to each other is disposed to the accommodation portion with the first side shorter than the second side; and multiple reflective sidewalls are disposed on the second side.

* * * * *